(12) United States Patent
Tong et al.

(10) Patent No.: US 7,445,944 B2
(45) Date of Patent: Nov. 4, 2008

(54) PACKAGING SUBSTRATE AND MANUFACTURING METHOD THEREOF

(75) Inventors: Ho-Ming Tong, Taipei (TW); Teck-Chong Lee, Kaohsiung (TW); Chao-Fu Weng, Tainan (TW); Chian-Chi Lin, Tainan (TW); Che-Ya Chou, Kaohsiung (TW); Shin-Hua Chao, Kaohsiung (TW); Song-Fu Yang, Kaohsiung (TW); Kao-Ming Su, Kaohsiung (TW)

(73) Assignee: ASE (Shanghai) Inc., Shanghai (CN)

( * ) Notice: Subject to any disclaimer, the term of this patent is extended or adjusted under 35 U.S.C. 154(b) by 0 days.

(21) Appl. No.: 11/646,244

(22) Filed: Dec. 28, 2006

(65) Prior Publication Data

US 2008/0124836 A1 May 29, 2008

(30) Foreign Application Priority Data

Aug. 23, 2006 (TW) .............................. 95131030 A

(51) Int. Cl.
*H01L 21/00* (2006.01)
(52) U.S. Cl. .................... 438/4; 257/E21.598; 438/107
(58) Field of Classification Search .................. 438/15, 438/4, 106, 107; 257/E21.598
See application file for complete search history.

(56) References Cited

U.S. PATENT DOCUMENTS

| | | | |
|---|---|---|---|
| 6,481,098 B1 * | 11/2002 | Lin Chen | 29/829 |
| 6,551,855 B1 * | 4/2003 | Ding et al. | 438/106 |
| 2005/0160594 A1 * | 7/2005 | Sin | 29/833 |
| 2007/0087630 A1 * | 4/2007 | Ku | 439/607 |

FOREIGN PATENT DOCUMENTS

| | | |
|---|---|---|
| TW | I237353 | 12/1992 |
| TW | 499750 | 8/2002 |

* cited by examiner

*Primary Examiner*—Michelle Estrada
*Assistant Examiner*—Kevin A Parendo
(74) *Attorney, Agent, or Firm*—Thomas, Kayden, Horstemeyer & Risley

(57) ABSTRACT

A packaging substrate and a manufacturing method thereof are provided. The manufacturing method includes following steps. First, a first packaging substrate including several first substrate units and at least one defected substrate unit is provided. Next, the defected substrate unit is separated from the packaging substrate, and at least one opening is formed in a frame of the first packaging substrate correspondingly. Then, a second substrate unit is provided. The shape of the second substrate unit is different from the shape of the opening. Afterwards, the second substrate unit is disposed in the opening.

14 Claims, 12 Drawing Sheets

PACKAGING SUBSTRATE AND MANUFACTURING METHOD THEREOF

This application claims the benefit of Taiwan application Serial No. 95131030, filed Aug. 23, 2006, the subject matter of which is incorporated herein by reference.

BACKGROUND OF THE INVENTION

1. Field of the Invention

The invention relates in general to a packaging substrate and a manufacturing method thereof, and more particularly to a packaging substrate including all good substrate units and a manufacturing method thereof.

2. Description of the Related Art

As developing rapidly and applied to all kinds of electronic products, semiconductor technology brings convenience to everyone's daily life. In the semiconductor packages, inner circuits of the chips are electrically connected to outer circuits through bumps, lead frames or wires. The packages protect the semiconductor chips from collision and moisture. Nowadays, the circuits of the chips become more and more complicated, and the number of electric contacts increases. As a result, the semiconductor packages evolve from dual in line packages (DIP) into packages with dense pins and suitable for high-speed chips, such as ball grid array (BGA) packages. As all kinds of electronic products emerge into the market, the demand for chips increases greatly. Therefore, semiconductor-packaging technology plays a very important role in the industrial development nowadays.

FIG. 1 is a cross-sectional view of a conventional ball grid array package. Please referring to FIG. 1, a package 10 includes a packaging substrate 14, several gold wires 12, a chip 11, a packaging resin 13, several tin balls 15 and a silver adhesive 16. The packaging substrate 14 includes a circuit (not shown in FIG. 1). Several contacts on a lower surface 14b of the packaging substrate 14 are electrically connected to the circuit. The tin balls 15 are adhered to the contacts for electrically connecting the package 10 and an outer electronic device. The chip 11 includes several bonding pads 17. The chip 11 is attached to an upper surface 14a of the packaging substrate 14 through the silver adhesive 16. The bonding pads 17 are electrically connected to the circuit through the gold wires 12. The packaging resin 13 disposed on the packaging substrate 14 covers the gold wires 12 and the chip 11, for physically protecting the gold wires 12 and the chip 11. For example, the resin 13 protects the gold wires 12 and the chip 11 from collision and moisture.

Furthermore, in order to increase the packaging efficiency, a strip substrate is used for packaging several chips at the same time instead of using only one substrate to package one chip at a time. Please referring to FIG. 2, a conventional strip packaging substrate is illustrated in FIG. 2. A strip packaging substrate 20 includes several substrate units 21 arranged linearly. However, not all of the substrate units 21 on the strip packaging substrate 20 are good. Defected substrate units 21 result in defected packages. As a result, the yield rate is decreased. Generally speaking, when the number of defected substrate units 21 of the strip packaging substrate 20 reaches a certain amount, the strip packaging substrate 20 with the defected substrate units 21 and some good substrate units 21 are discarded at the same time. As a result, the good substrate units 21 in the discarded packaging substrate are wasted, so the cost is increased relatively. Therefore, it is very important to ensure that all the substrate units 21 on the strip packaging substrate 20 are good, so that good substrate units 21 can be utilized effectively.

SUMMARY OF THE INVENTION

The invention is directed to a packaging substrate and a manufacturing method thereof. Defected substrate units are removed from the packaging substrate, and openings are formed correspondingly. Then, second substrate units with a shape different from the openings are placed in the openings. As a result, the packaging efficiency is increased, and the cost is lowered. Furthermore, the accuracy of the manufacturing process and the quality of the chip packaging are increased.

According to a first aspect of the invention, a manufacturing method of a packaging substrate is provided. The manufacturing method included following steps. First, a first packaging substrate is provided. The first packaging substrate includes several first substrate units and at least one defected substrate unit. Next, the defected substrate unit is separated from the packaging substrate, and at least one opening is formed in a frame of the first packaging substrate correspondingly. Then, a second substrate unit is provided. The shape of the second substrate unit is different from the shape of the opening. Afterwards, the second substrate unit is disposed in the opening.

According to a second aspect of the present invention, a packaging substrate is provided. The packaging substrate includes a frame, several first substrate units and at least one second substrate unit. At least one opening is formed in the frame. The first substrate units and the frame are formed integrally. The second substrate unit is disposed in the opening. The shape of the opening is different from the shape of the second substrate unit. The first substrate units and the second substrate unit are arranged in an array on the packaging substrate.

The invention will become apparent from the following detailed description of the preferred but non-limiting embodiments. The following description is made with reference to the accompanying drawings.

DETAILED DESCRIPTION OF THE INVENTION

Figure 1:
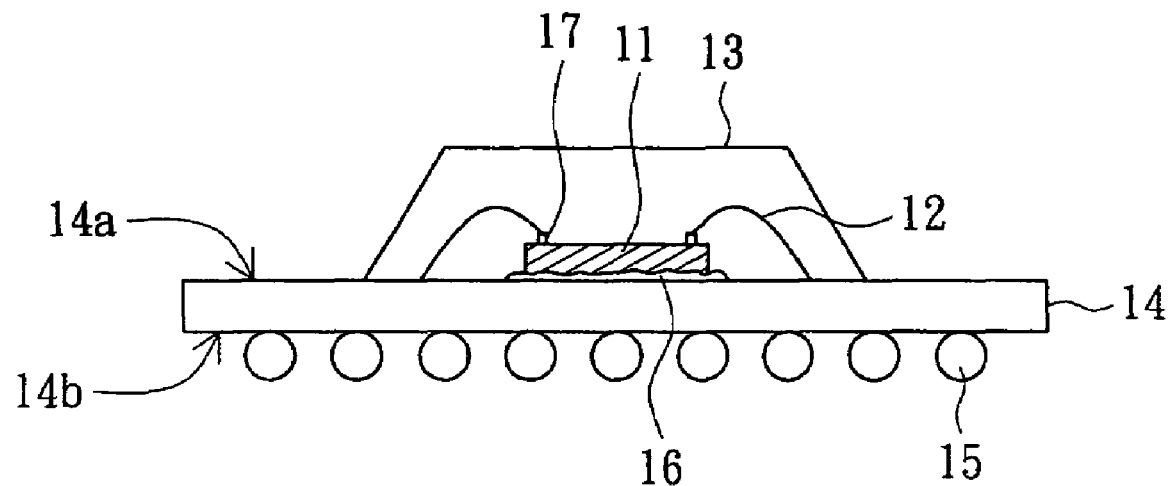
FIG. 1 (Prior Art) is a cross-sectional view of a conventional ball grid array package.
Figure 2:
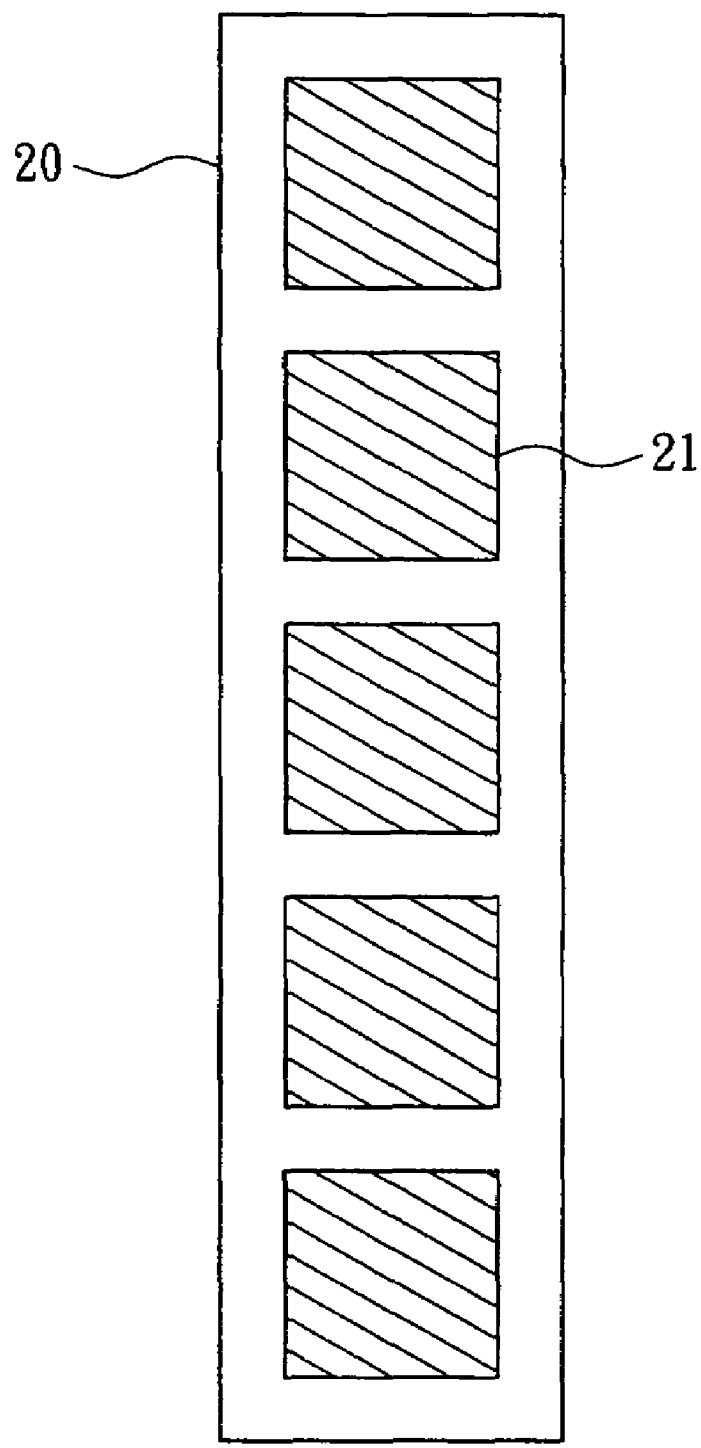
FIG. 2 (Prior Art) illustrates a conventional strip packaging substrate.
Figure 3:
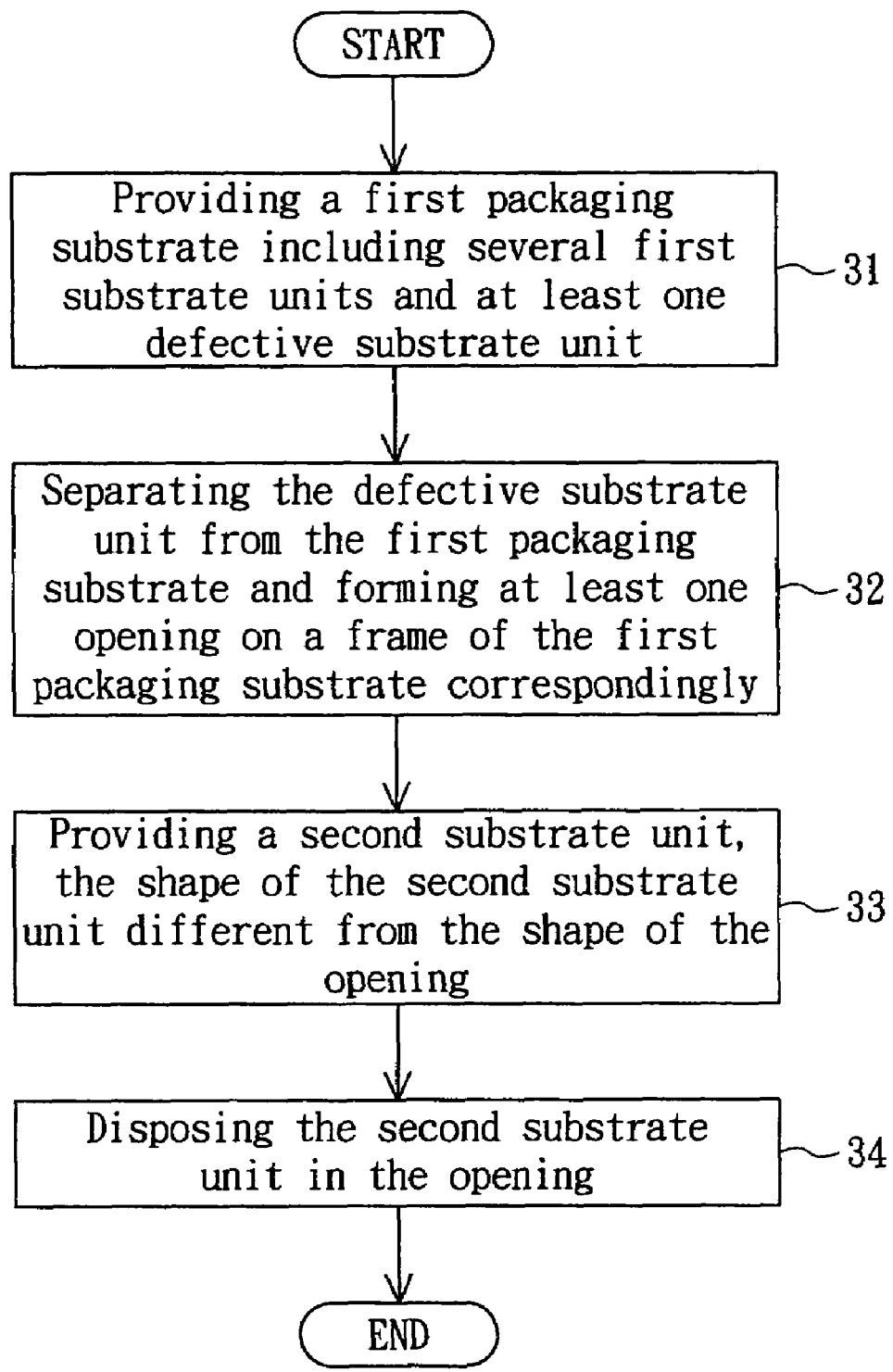
FIG. 3 is a flow chart of a manufacturing method of a packaging substrate according to a preferred embodiment of the invention.
Figure 4A:
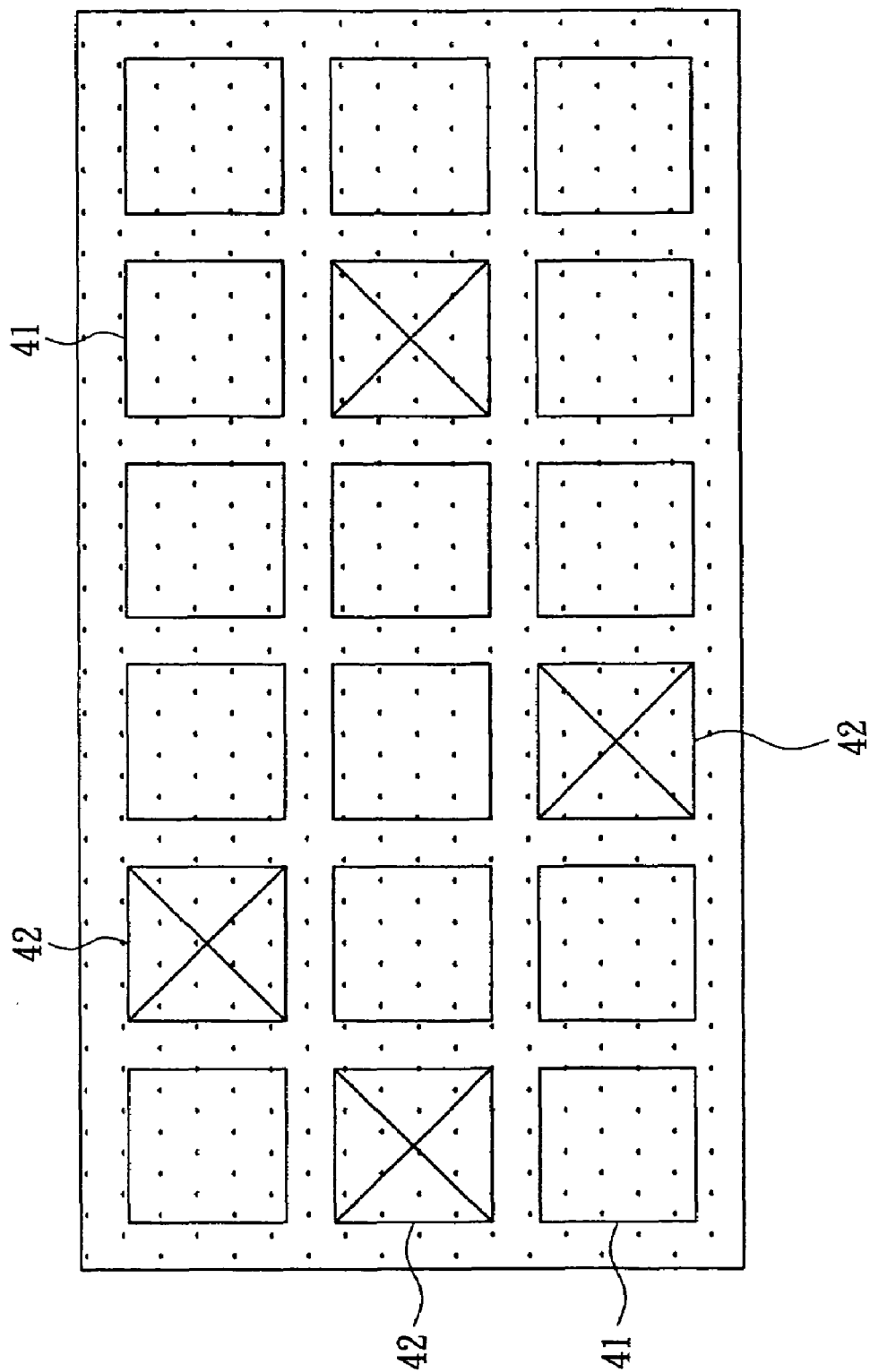
FIG. 4A illustrates a first packaging substrate in a step 31 in FIG. 3.
Figure 4B:
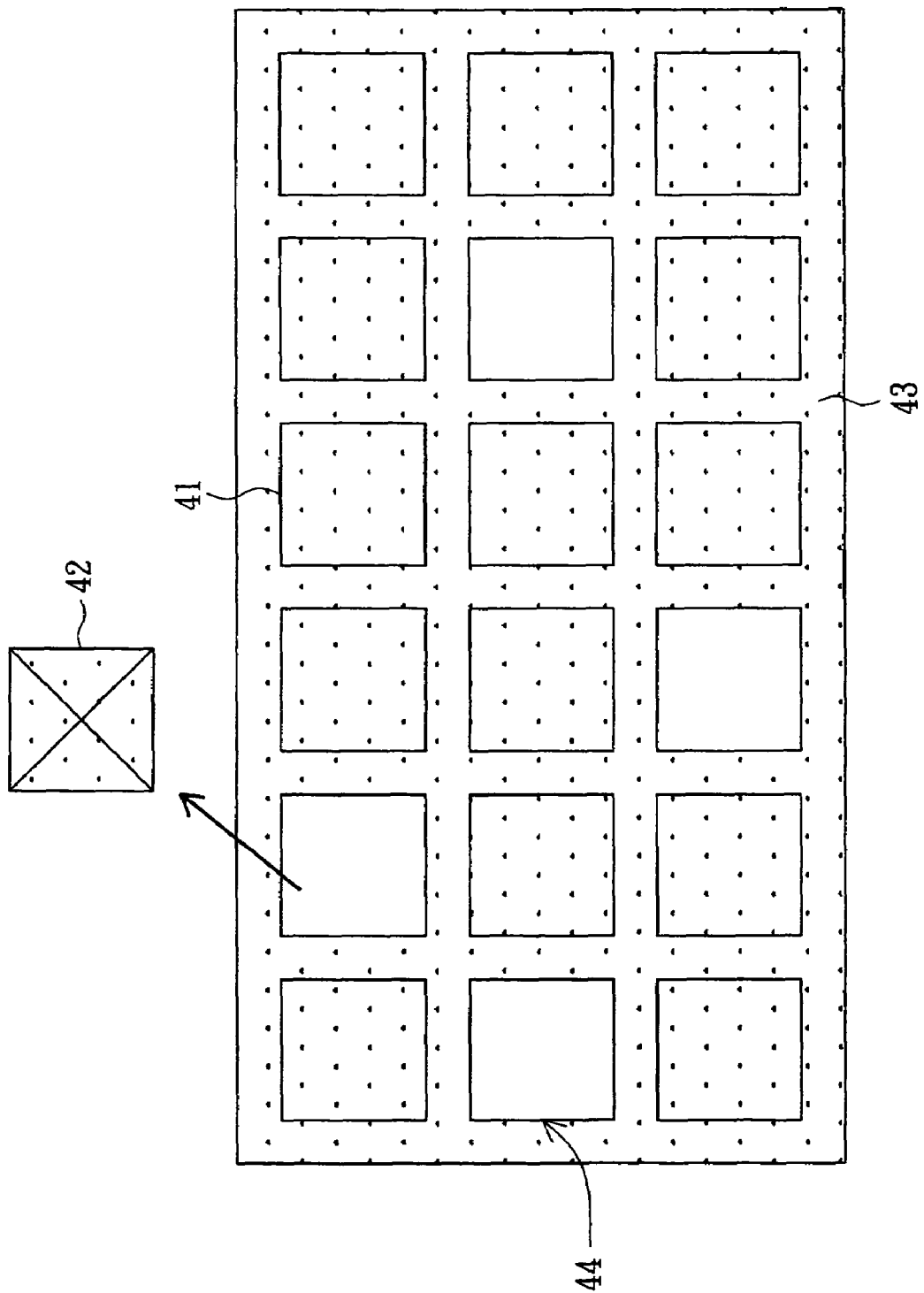
FIG. 4B illustrates the first packaging substrate in a step 32 in FIG. 3.
Figure 4C:
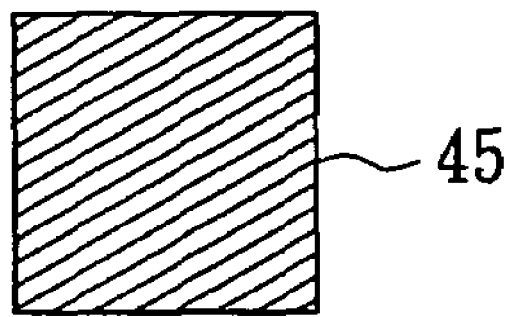
FIG. 4C illustrates a second substrate unit in a step 33 in FIG. 3.
Figure 4C:
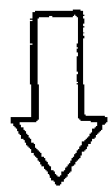
Figure 4C:
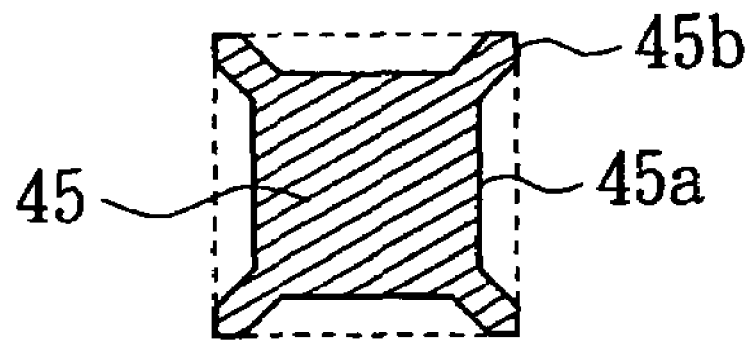

Please refer to FIG. 3 and FIGS. 4A~4C at the same time. FIG. 3 is a flow chart of a manufacturing method of a packaging substrate according to a preferred embodiment of the invention. FIGS. 4A~4B illustrate a first packaging substrate in a step 31 and a step 32 in FIG. 3 respectively. FIG. 4C illustrates a second substrate unit in a step 33 in FIG. 3. First, in the step 31 in FIG. 3, a first packaging substrate 40 is provided, as shown in FIG. 4A. The first packaging substrate 40 includes several first substrate units 41 and at least one defected substrate unit 42. In the present embodiment, the first packaging substrate 40 includes several defected substrate units 42. The first substrate units 41 are exemplified by ball grid array (BGA) substrates and arranged in an array on the first packaging substrate 40.

Next, in the step 32 in FIG. 3, the defected substrate units 42 are separated from the first packaging substrate 40. At least one opening 44 is formed in a frame 43 of the first packaging substrate 40 correspondingly, as shown in FIG. 4B. The opening 44 is rectangular for example. In the present embodiment, several defected substrate units 42 are separated from the first packaging substrate 40, and several openings 44 are formed in the frame 43 correspondingly.

Then, in the step 33 in FIG. 3, at least one second substrate unit 45 is provided, as shown in FIG. 4C. The second substrate unit 45 is separated from a second packaging substrate (not shown in FIG. 4C). In the present embodiment, several second substrate units 45 are provided according to the number of the openings 44 (shown in FIG. 4B). The second substrate units 45 are exemplified by ball grid array (BGA) substrates. In the step 33, at least one recess 45a is formed on the edge of the second substrate unit 45. As a result, when each second substrate unit 45 is placed into each opening 44, the edge of each second substrate unit 45 partially contacts the frame 43. In the present embodiment, four recesses 45a and four protruding parts 45b are formed on the edges of each second substrate unit 45. The protruding parts 45b are formed at four corners of each second substrate unit 45. Each recess 45a is formed between two adjacent protruding parts 45b. As a result, the second substrate units 45 have a different shape from the openings 44.

Figure 4D:
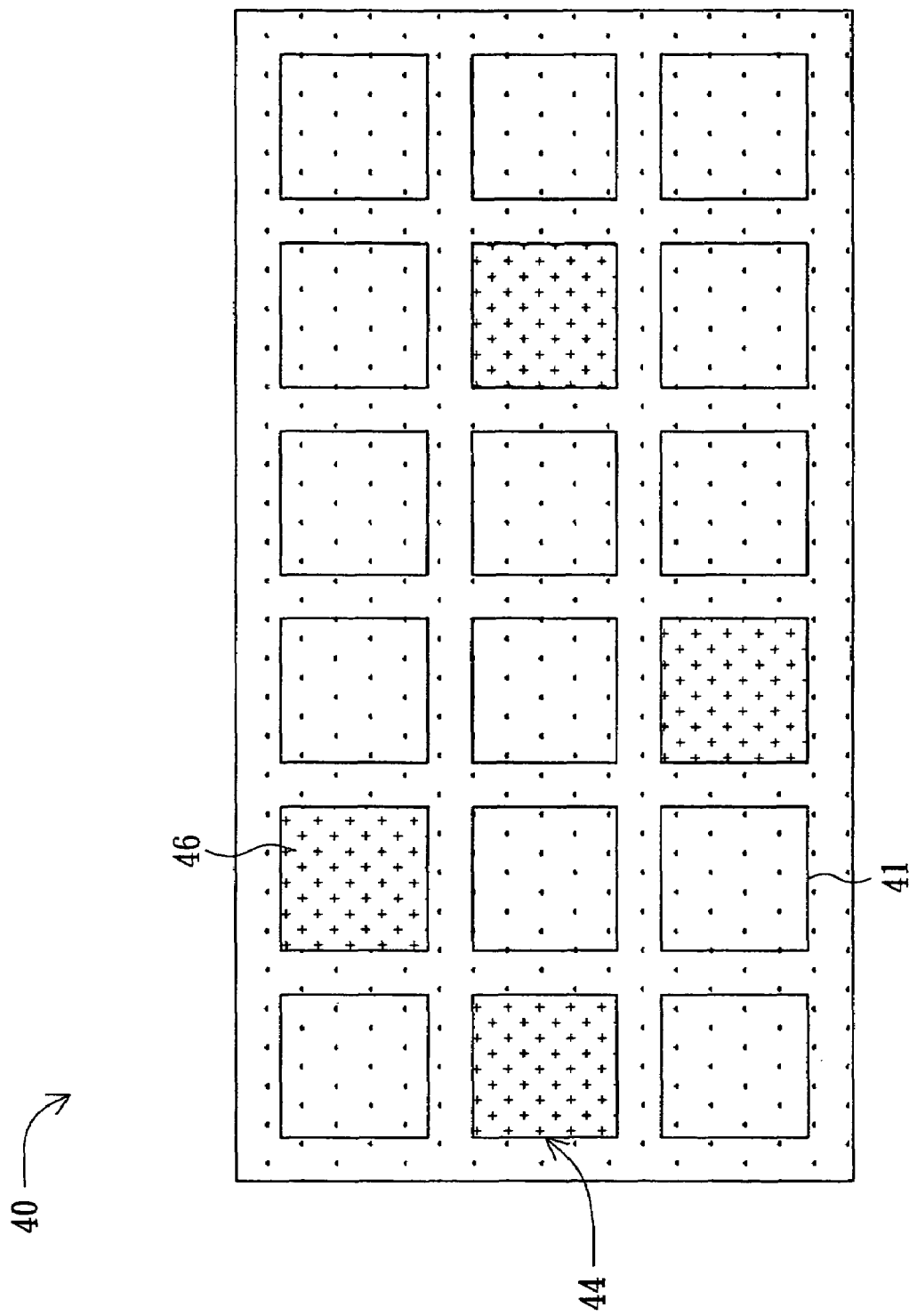
FIG. 4D illustrates an adhesive film disposed on a lower surface of the first packaging substrate in FIG. 4B.
Figure 4E:
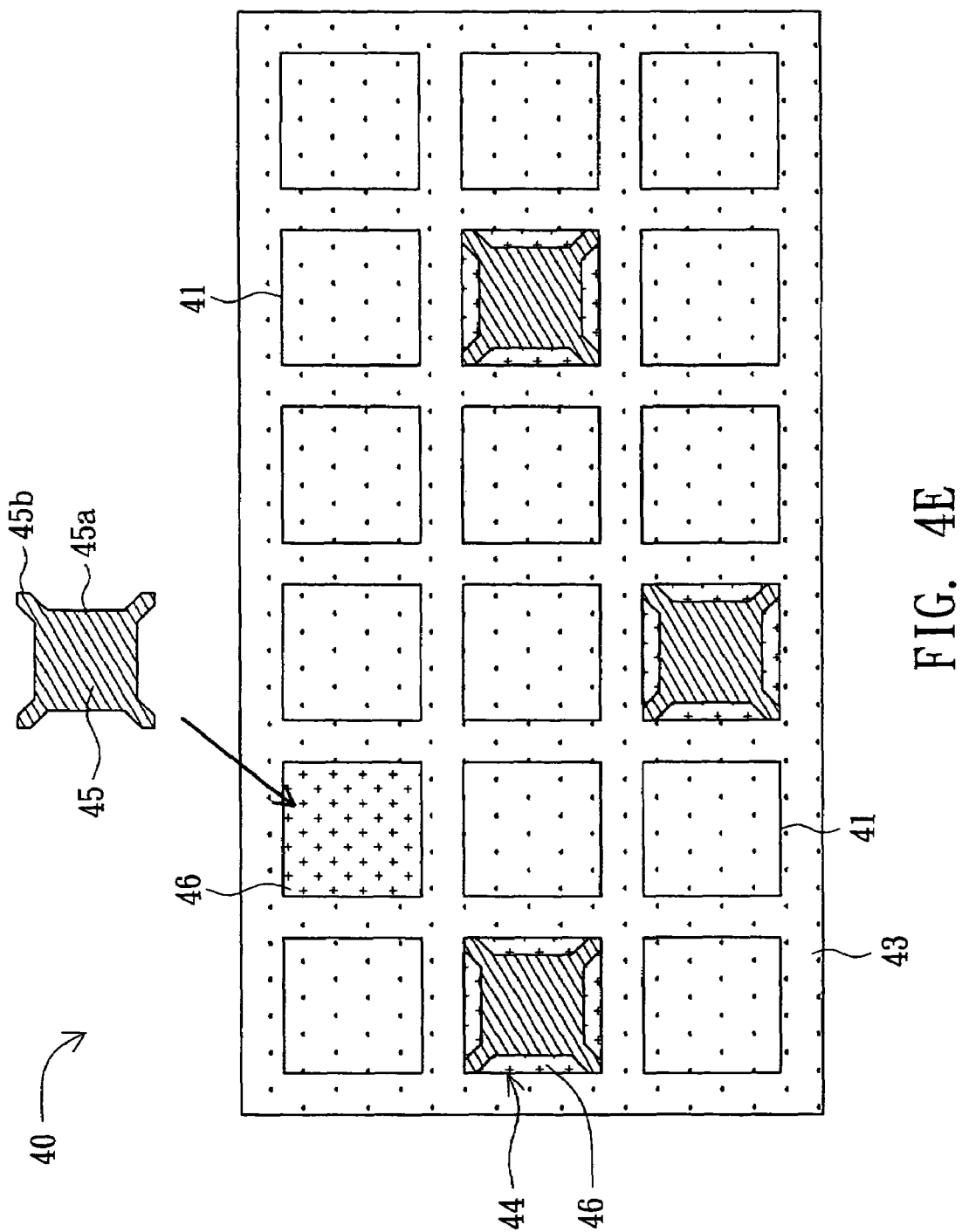
FIG. 4E illustrates the first packaging substrate with the second substrate units adhered to the adhesive film.
Figure 4F:
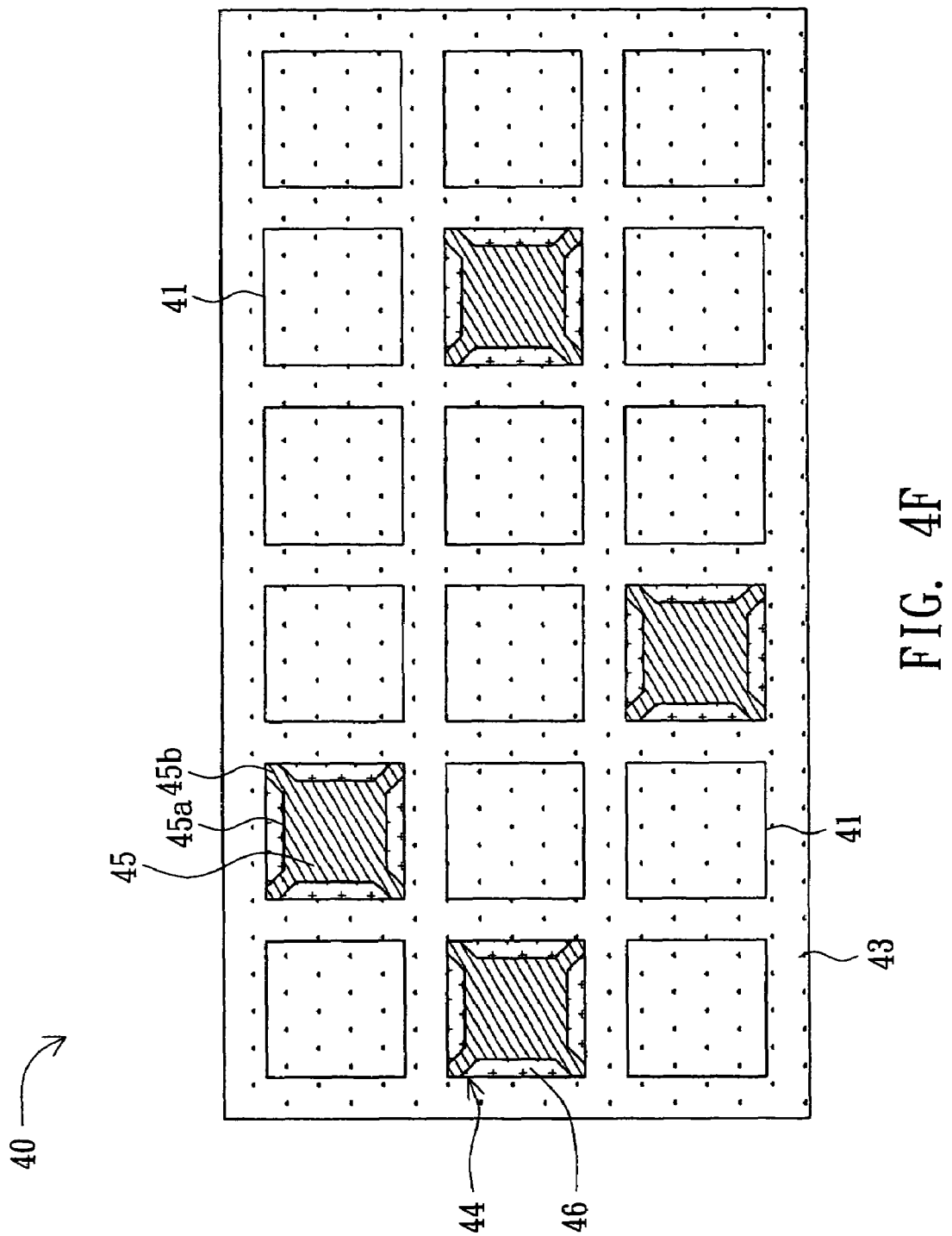
FIG. 4F illustrates the first packaging substrate after a step 34 in FIG. 3.

Afterwards, in a step 34 in FIG. 3, the second substrate units 45 are disposed in the openings 44. Please refer to FIGS. 4D~4E at the same time. FIG. 4D illustrates an adhesive film disposed on a lower surface of the first packaging substrate. FIG. 4E illustrates the first packaging substrate with the second substrate unit adhered to the adhesive film. First, as shown in FIG. 4D, an adhesive film 46 is provided on a lower surface (the reverse side of the paper) of the first packaging substrate 40. The adhesive film 46 covers the entire lower surface. The adhesive film 46 is an ultraviolet adhesive film for example. Each opening 44 exposes a portion of the adhesive film 46. Next, as shown in FIG. 4E, the second substrate units 45 are adhered to the adhesive film 46 for disposing the second substrate units 45 in the openings 44. Meanwhile, the protruding parts 45b of each second substrate unit 45 are placed against the side walls of each opening 44. The protruding parts 45b are used for positioning each second substrate unit 45 in each opening 44. Please referring to FIG. 4F, a packaging substrate after the step 34 in FIG. 3 is illustrated in FIG. 4F. The packaging substrate 50 of the present embodiment is accomplished.

Figure 5A:
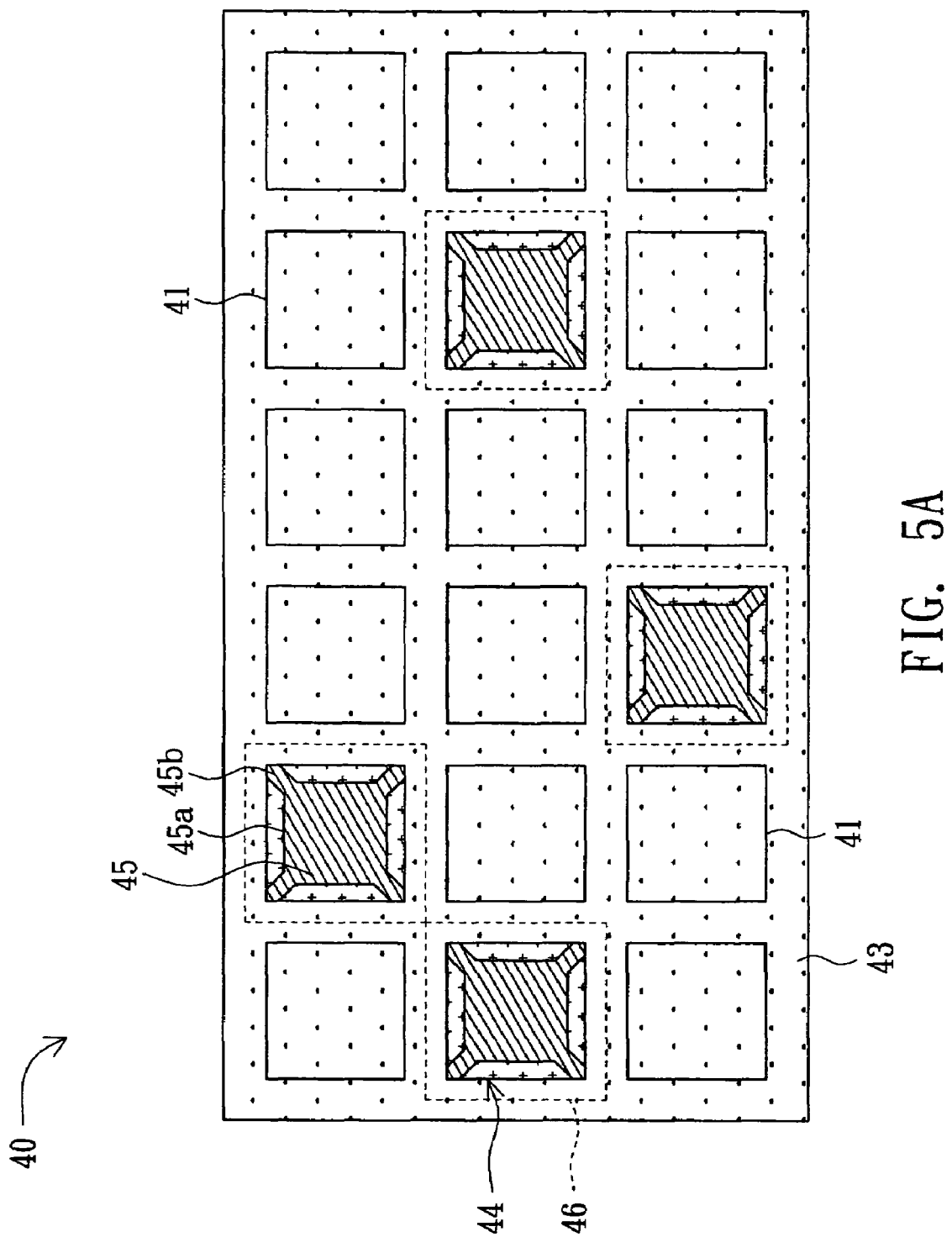
FIG. 5A illustrates a packaging substrate with the adhesive film disposed on a portion of the lower surface.
Figure 5B:
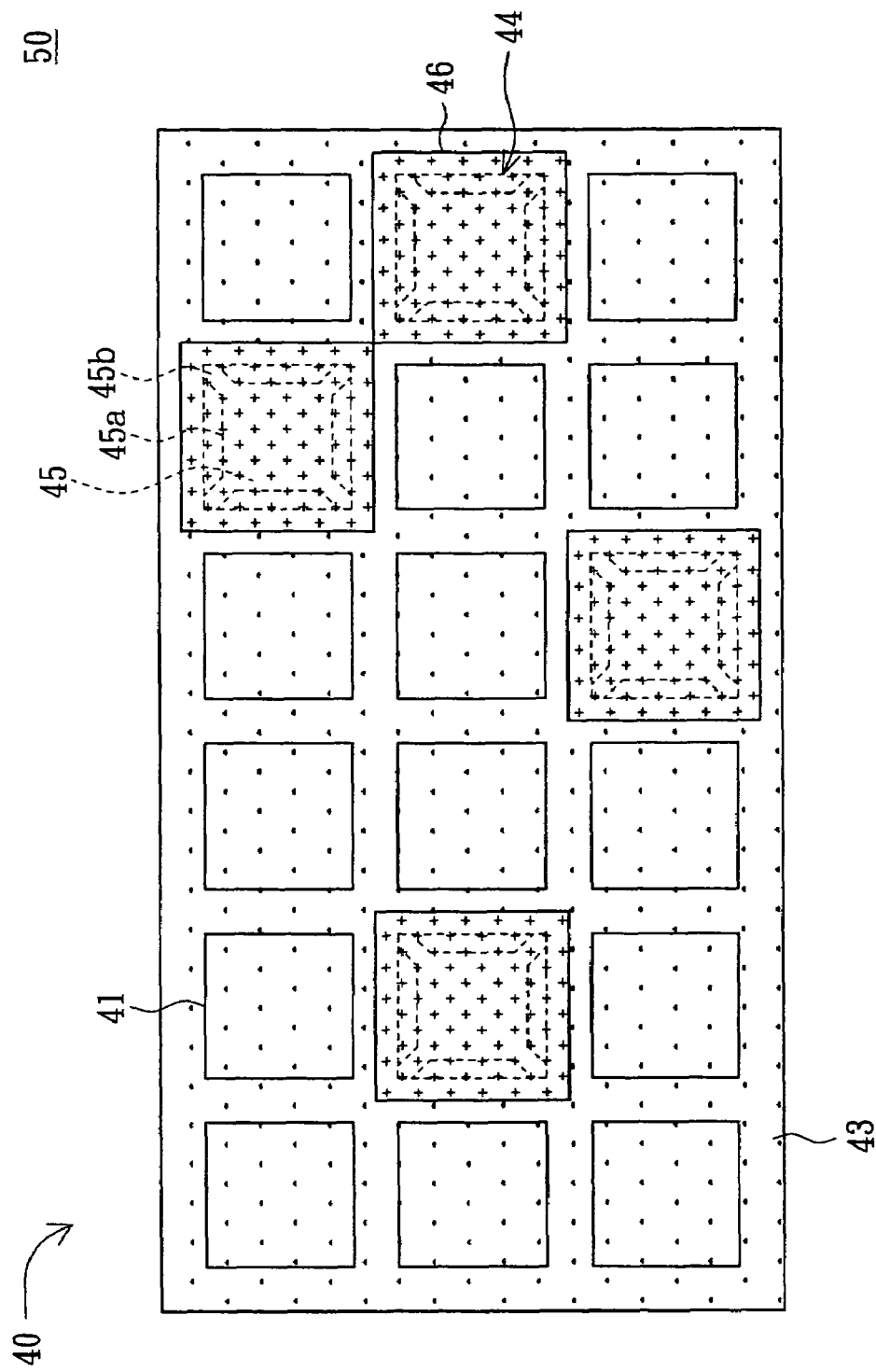
FIG. 5B is a bottom view of the packaging substrate in FIG. 5A.

In the step 34 in FIG. 3, the adhesive film 46 is adhered to the entire lower surface. However, the adhesive film 46 can be disposed only on a portion of the lower surface adjacent to the openings 44. Please refer to FIGS. 5A~5B at the same time. FIG. 5A illustrates a packaging substrate with the adhesive film disposed on a portion of the lower surface. FIG. 5B illustrates a bottom view of the packaging substrate in FIG. 5A. When the adhesive film 46 is only disposed on a portion of the lower surface adjacent to the openings 44, the amount of the used adhesive film 46 is saved. As a result, the cost is reduced. And the second substrate units 45 are disposed in the openings 44 by adhering to the adhesive film 46.

Figure 6:
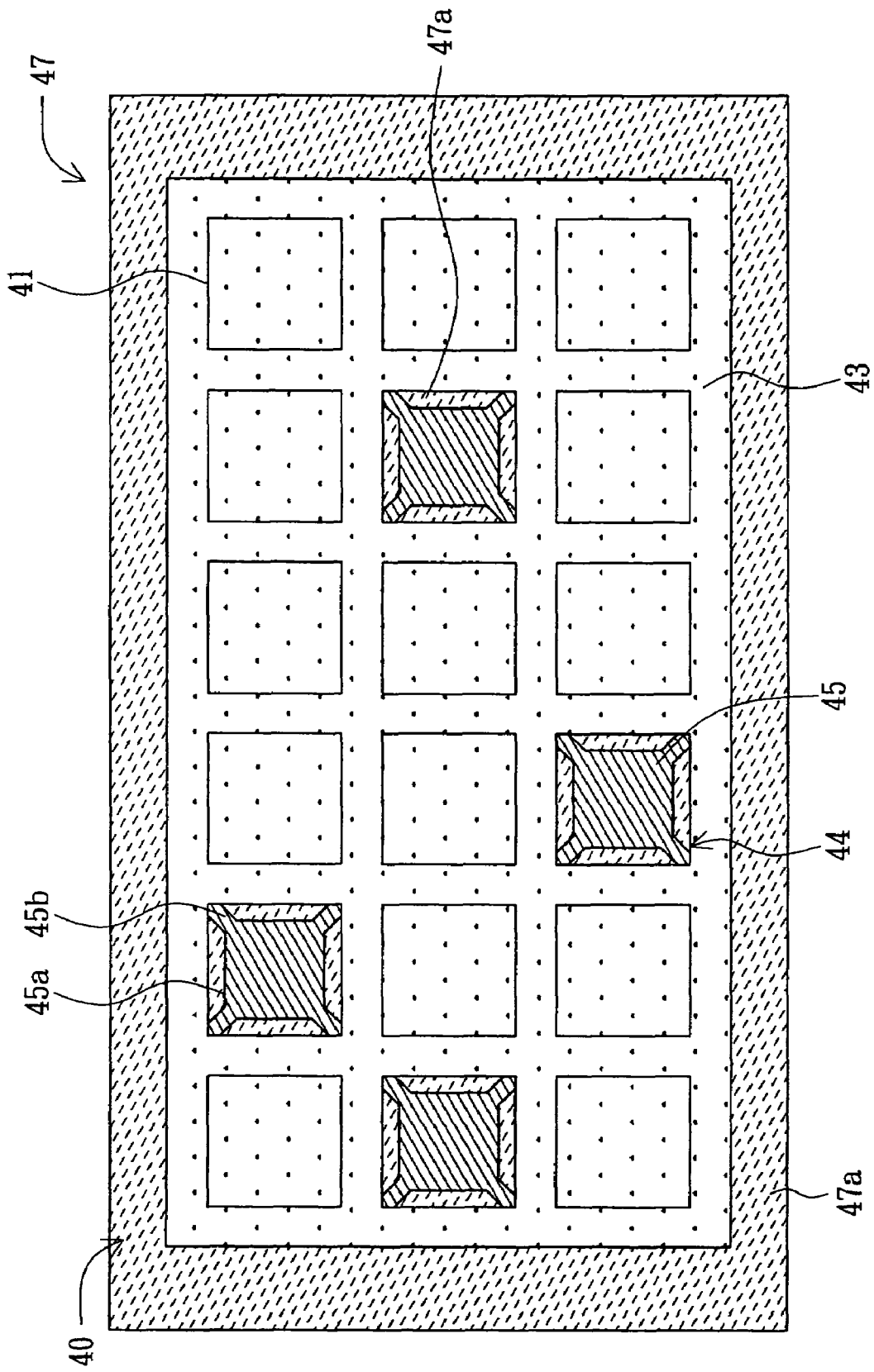
FIG. 6 illustrates the first packaging substrate on a carrier.

Moreover, please referring to FIG. 6, the first packaging substrate on a carrier is illustrated in FIG. 6. In the manufacturing process, the first packaging substrate 40 can be disposed on a carrier 47. An adhesive layer 47a is formed on the surface of the carrier 47, and each opening 44 exposes a portion of the adhesive layer 47a. The second substrate units 45 are adhered to the adhesive layer 47a, so that the second substrate units 45 are disposed in the openings 44. As a result, each second substrate unit 45 is disposed in each opening 44 when the carrier 47 transports the first packaging substrate 40. The manufacturing process is simplified, and the time is saved.

In the present embodiment, the first packaging substrate 40, the first substrate units 41, the second substrate units 45 and the frame 43 are made of polyimide or bismaleimide triazine resin (BT resin) for example. The protruding parts 45b are formed at the corners of each second substrate unit 45 (as shown in FIG. 4F). When the second substrate units 45 are disposed in the openings 44, the edges of each second substrate unit 45 partially contact with the frame 43. As a result, the stress that the second substrate units 45 apply to the frame 43 is relieved. Therefore, the frame 43 is prevented from deforming, and the chips are packaged on the packaging substrate accurately in the following process. Furthermore, the protruding parts 45b are placed against each opening 44 for fixing the second substrate units 45 in the openings 44. As a result, during the packaging process, the second substrate units 45 do not move relatively to the frame 43 to maintain the quality of the chip packaging. Moreover, the shape of the second substrate units 45 is different from that of the openings 44. Therefore, the shape of the second substrate units 45 does not have to exactly match the shape of the openings 44. Instead, only the recesses 45a need to be formed to lodge the second substrate units 45 in the openings 44. As a result, the manufacturing efficiency of the packaging substrate 50 is increased.

In the packaging substrate and a manufacturing method thereof according to the preferred embodiment of the invention, several defected substrate units are removed from a first packaging substrate. Several openings are formed in the first packaging substrate correspondingly. Then, several good second substrate units are separated from a second packaging substrate and disposed in the openings. As a result, a packaging substrate with all good substrate units is formed. Moreover, each second substrate unit includes several recesses and protruding parts. The shape of the second substrate units is different from that of the openings. The advantages are as follow.

Because all the substrate units on the packaging substrate are good, the yield rate of the manufacturing process is increased, and the cost is reduced.

The first substrate units and the second substrate units are arranged in an array, so that several chips are packaged on a single packaging substrate at the same time. The packaging efficiency is increased.

The shape of the second substrate units is different from that of the openings. Therefore, when the second substrate units are separated from the second packaging substrate, the shape of the second substrate units does not have to match the shape of the openings accurately. The manufacturing efficiency is increased accordingly.

Moreover, the recesses do not contact the frame of the packaging substrate. As a result, when the second substrate units are disposed in the openings, the stress applied to the frame is relieved. The frame is prevented from deforming to maintain the accuracy of the manufacturing process.

Furthermore, the protruding parts of the second substrate units are placed against the openings. When the chips are packaged, the second substrate units do not move relatively to the frame. The quality of the chip packaging is increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a packaging substrate, the method comprising:
    providing a first packaging substrate comprising a plurality of first substrate units and at least one defected substrate unit;
    separating the defected substrate unit from the first packaging substrate to form at least one opening in a frame of the first packaging substrate;
    providing at least one second substrate unit, wherein the second substrate unit has at least one recess, the recess is disposed on an edge of the second substrate unit and is not disposed at any corner of the second substrate unit, and a shape of the second substrate unit is different from a shape of the opening; and
    disposing the second substrate unit in the opening, wherein the edge of the second substrate unit partially contacts the frame.

2. The manufacturing method according to claim 1, wherein the second substrate unit is separated from a second packaging substrate.

3. The manufacturing method according to claim 1, wherein the first substrate units are arranged in an array on the first packaging substrate.

4. The manufacturing method according to claim 1, wherein in the step of providing the second substrate unit,
    the second substrate unit has four recesses and four protruding parts on the edges of the second substrate unit, the protruding parts are formed at four corners of the second substrate unit, the recesses are formed between the neighboring protruding parts, and each of the corners is right-angled.

5. The manufacturing method according to claim 4, wherein the step of disposing the second substrate unit further comprises:
    placing the protruding parts against the side walls of the opening for positioning the second substrate unit in the opening.

6. The manufacturing method according to claim 1, wherein the step of disposing the second substrate unit further comprises:
    providing an adhesive film on a lower surface of the first packaging substrate, the opening exposing a portion of the adhesive film; and
    adhering the second substrate unit on the adhesive film for disposing the second substrate unit in the opening.

7. The manufacturing method according to claim 6, wherein the adhesive film covers the entire lower surface.

8. The manufacturing method according to claim 6, wherein the adhesive film is disposed on a portion of the lower surface adjacent to the opening.

9. The manufacturing method according to claim 6, wherein the adhesive film is ultraviolet adhesive film.

10. The manufacturing method according to claim 1, wherein the step of disposing the second substrate unit further comprises:
    disposing the first packaging substrate on a carrier, an adhesive layer formed on a surface of the carrier, the opening exposing a portion of the adhesive layer; and
    adhering the second substrate unit on the adhesive layer for disposing the second substrate unit in the opening.

11. The manufacturing method according to claim 1, wherein the opening is a quadrangle structure having four right-angled corners and four straight edges connected to two of the neighboring right-angled corners.

12. The manufacturing method according to claim 1, wherein each of the recesses is a trapezoid-like structure.

13. The manufacturing method according to claim 1, wherein an area of the recesses is larger than the area of the protruding parts.

14. A manufacturing method of a packaging substrate, the method comprising:
    providing a first packaging substrate comprising a plurality of first substrate units and at least one defected substrate unit;
    separating the defected substrate unit from the first packaging substrate to form at least one opening having four right-angled corners and four straight edges connected to two of the neighboring right-angled corners;
    providing at least one second substrate unit, a shape of the second substrate unit different from a shape of the opening; and
    disposing the second substrate unit in the opening.

* * * * *